US006858864B2

(12) United States Patent
Atanackovic et al.

(10) Patent No.: US 6,858,864 B2
(45) Date of Patent: *Feb. 22, 2005

(54) DEVICES WITH OPTICAL GAIN IN SILICON

(75) Inventors: Petar B. Atanackovic, Palo Alto, CA (US); Larry R. Marshall, Mountain View, CA (US)

(73) Assignee: Translucent Photonics, Inc., Palo Alto, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/825,974

(22) Filed: Apr. 16, 2004

(65) Prior Publication Data

US 2004/0188669 A1 Sep. 30, 2004

Related U.S. Application Data

(63) Continuation of application No. 09/924,392, filed on Aug. 7, 2001, now Pat. No. 6,734,453.
(60) Provisional application No. 60/223,874, filed on Aug. 8, 2000.

(51) Int. Cl.[7] .......................................... H01L 31/0288
(52) U.S. Cl. ............................. 257/17; 257/13; 257/18; 257/21; 257/22
(58) Field of Search ........................... 257/13, 17, 18, 257/21, 22

(56) References Cited

U.S. PATENT DOCUMENTS

| 4,618,381 A | 10/1986 | Sato et al. ................. 148/189 |
| 4,959,694 A | 9/1990 | Gell ............................. 357/16 |
| 5,033,816 A | 7/1991 | Blondeau et al. ....... 350/162.22 |
| 5,039,190 A | 8/1991 | Blonder et al. ............. 359/341 |
| 5,107,538 A | 4/1992 | Benton et al. .............. 385/130 |
| 5,119,460 A | 6/1992 | Bruce et al. ................ 385/142 |

(List continued on next page.)

FOREIGN PATENT DOCUMENTS

| EP | 0 474 447 A1 | 3/1992 | ............ G02B/6/10 |
| EP | 0 517 440 A2 | 12/1992 | ............ H01S/3/06 |
| EP | 0 578 407 A1 | 1/1994 | ............ H01S/3/06 |
| EP | 1 215 781 A2 | 6/2002 | ............ H01S/5/34 |
| JP | 5-283743 | 10/1993 | ........... H01L/33/00 |

OTHER PUBLICATIONS

Shin et al, Applied Physics Letters, vol. 74 No. 11, "1.54um Er3+ . . . superlattices" pp. 1573–1575.*

Shin, J.H. et al., "Controlling the Quantum effects and Erbium–Carrier Interaction Using Si/SiO/sub 2/superlattices", Rare–Earth–Doped Materials and Devices, vol. 4282, Jan. 2001, pp. 142–152.

(List continued on next page.)

Primary Examiner—Jerome Jackson
(74) Attorney, Agent, or Firm—Heller Ehrman White & McAuliffe; Paul Davis

(57) ABSTRACT

A photonic device includes a silicon semiconductor based superlattice. The superlattice has a plurality of layers that form a plurality of repeating units. At least one of the layers in the repeating unit is an optically active layer with at least one species of rare earth ion.

108 Claims, 12 Drawing Sheets

U.S. PATENT DOCUMENTS

| | | | |
|---|---|---|---|
| 5,181,211 A | | 1/1993 | Burnham et al. ............. 372/21 |
| 5,262,656 A | | 11/1993 | Blondeau et al. ............. 257/80 |
| 5,282,260 A | | 1/1994 | Buchal et al. ............. 385/132 |
| 5,351,146 A | | 9/1994 | Chan et al. ................ 359/118 |
| 5,355,237 A | | 10/1994 | Lang et al. ................ 359/130 |
| 5,357,591 A | | 10/1994 | Jiang et al. .................... 385/37 |
| 5,363,398 A | * | 11/1994 | Glass et al. .................... 372/92 |
| 5,468,684 A | | 11/1995 | Yoshimori et al. .......... 437/228 |
| 5,473,174 A | | 12/1995 | Ohsawa ....................... 257/190 |
| 5,534,079 A | | 7/1996 | Beach .......................... 148/33 |
| 5,594,750 A | | 1/1997 | Zhang et al. ................. 372/45 |
| 5,634,973 A | | 6/1997 | Cabral, Jr. et al. ............ 117/95 |
| 5,646,425 A | | 7/1997 | Beach ........................ 257/102 |
| 5,647,038 A | | 7/1997 | Minden et al. ............... 385/37 |
| 5,654,814 A | * | 8/1997 | Ouchi et al. ................ 398/196 |
| 5,667,905 A | | 9/1997 | Campisano et al. ......... 428/690 |
| 5,719,077 A | | 2/1998 | Chakrabarti et al. ........ 438/129 |
| 5,719,416 A | | 2/1998 | Yoshimori et al. .......... 257/295 |
| 5,852,346 A | | 12/1998 | Komoda et al. ......... 315/169.3 |
| 5,917,195 A | | 6/1999 | Brown ......................... 257/22 |
| 5,920,078 A | | 7/1999 | Frey ............................ 257/14 |
| 5,942,050 A | | 8/1999 | Green et al. ................ 136/258 |
| 6,058,131 A | | 5/2000 | Pan ............................ 372/102 |
| 6,069,908 A | | 5/2000 | Yuen et al. .................... 372/96 |
| 6,208,681 B1 | * | 3/2001 | Thornton ...................... 372/96 |
| 6,222,951 B1 | * | 4/2001 | Huang .......................... 385/14 |
| 6,403,975 B1 | | 6/2002 | Brunner et al. ............... 257/15 |
| 6,456,423 B1 | | 9/2002 | Nayfeh et al. ............... 359/328 |
| 2002/0017657 A1 | | 2/2002 | Coffa et al. ................. 257/200 |
| 2002/0096675 A1 | | 7/2002 | Cho et al. ...................... 257/25 |
| 2002/0117673 A1 | | 8/2002 | Moon ........................... 257/79 |
| 2002/0131663 A1 | | 9/2002 | Marks et al. .................. 385/2 |
| 2002/0155673 A1 | | 10/2002 | Camalleri et al. ........... 438/343 |

OTHER PUBLICATIONS

Orlov, L.K. et al., "Comparative Analysis of Light Emitting Properties of Si:Er and Ge/Si/sub1–x/Ge/sub x/epitaxial Structures Obtained by MBE Method", Gettering and Defect Engineering in International Autumn Meeting, Sept. 1999, vol. 69–70, pp. 377–382.

Favennec, P.N. et al., "Optical Activation of ER3+ Implanted in Silicon By Oxygen Impurities", Japanese Journal of Applied Physics, vol. 29, No. 4, Apr. 1990, pp. L524–L526.

Hak–Seung, H. et al., "Control of Location and Carrier–Interaction of Erbium Using Erbium–Doped Si/SiO/sub2/ superlattic", Thin Films for Optical Waveguide Devices and Materials for Optical Limiting Symposium, vol. 597, pp. 29–30, 2000.

Ennen, H. et al., "1.54–MUM Luminescence of Erbium–Implanted III–V Semiconductors and Silicon", Applied Physics Letters, vol. 43, No. 10, Nov. 1983, pp. 943–945.

Favennec P.N. et al., "Optical Activation of Er3+ Implanted in Silicon By Oxygen Impurities", Jap. Journ. App. Phys. vol. 29, No. 4, Apr. 1990, pp. 524–526.

Han, H.S. et al., "Contol of Location and Carrier–Interaction of Erbium Using Erbium–Doped Si/SiO2 Superlattice", Dep. Phys. Korea Advanced Institute of Sci. and Techn., Nov. 30, 1999, pp. 27–32.

Orlov, L.K. et al., "Comparative Analysis of Light Emitting Properties of Si:Er and Ge/Si1–xGex Epitaxial Structure Obtained by MBE Method", Inst. Phys. of Microstructures, (1999) pp. 377–382.

Schneider, J. et al., "1.54–82 m Luminescence of Erbium–implanted III–V Semiconductors and Silicon", Appl. Phys. Lett. 43(10), Nov. 15, 1983, pp. 943–945.

Shin, J.H. et al., "Controlling the Quantum Effects and Ebrium–Carrier Interaction Using Si/SiO2 Superlattices", Dept. of Phys. Korea Advanced Institute, Jan. 22, 2001, pp. 142–152.

* cited by examiner

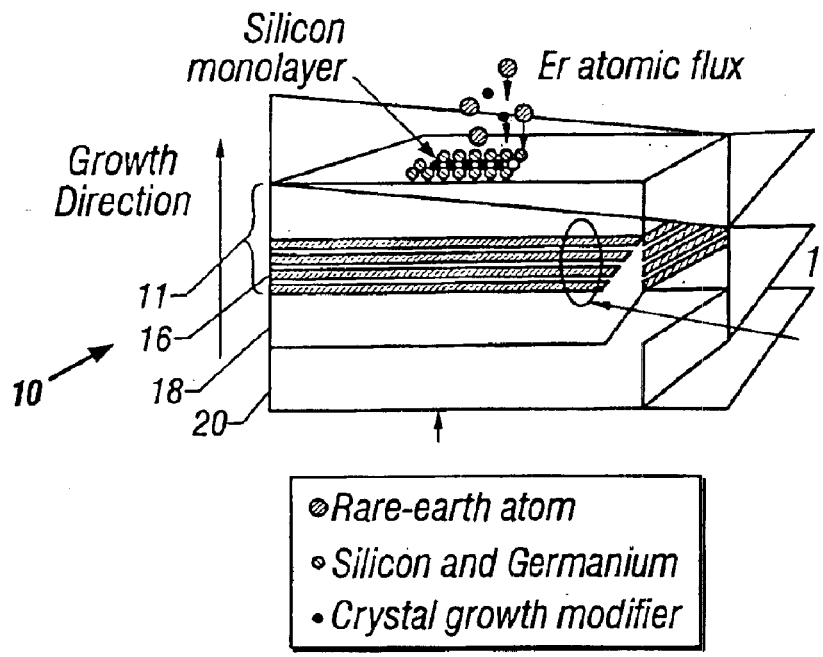
FIG. 2A
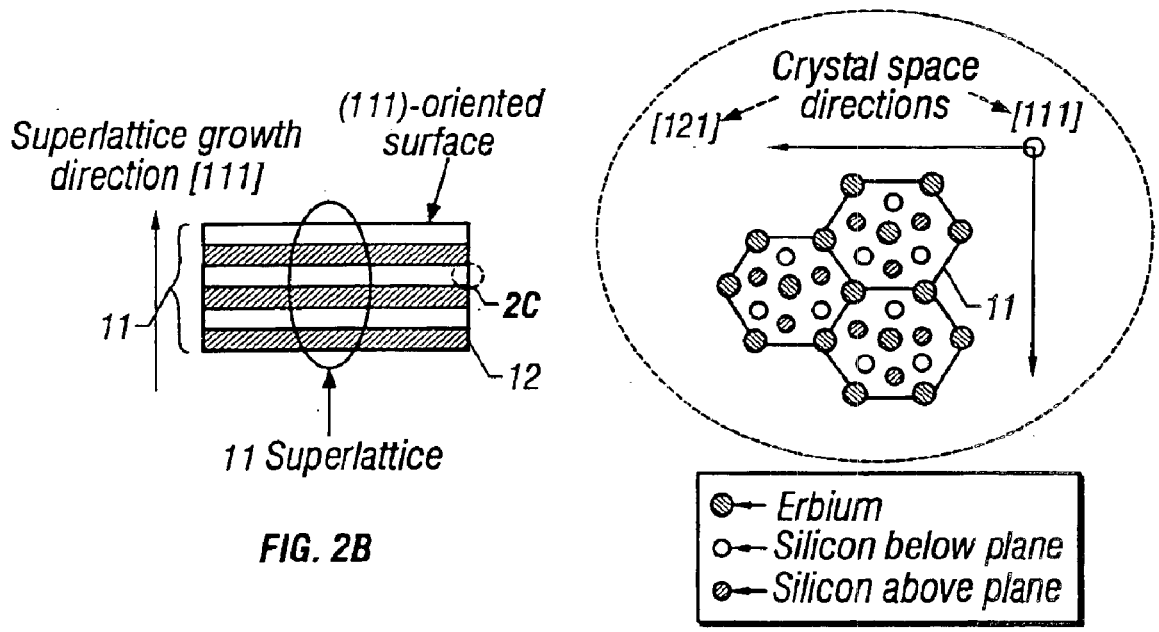
FIG. 2B
FIG. 2C

DEVICES WITH OPTICAL GAIN IN SILICON

CROSS REFERENCE TO RELATED APPLICATION

This application is a continuation of U.S. Ser. No. 09/924,392 filed Aug. 7, 2001, U.S. Pat. No. 6,734,453 which application claims the benefit of U.S. provisional application Ser. No. 60/223,874, filed Aug. 8, 2000, both applications of which are fully incorporated herein by reference.

BACKGROUND OF THE INVENTION

1. Field of Use

This invention relates generally to optical switching methods and apparatus, and more particularly to optical switching methods and apparatus that achieve optical gain in silicon.

2. Description of the Related Art

Communication networks increasingly rely upon optical fiber for high-speed, low-cost transmission. Optical fibers were originally envisioned as an optical replacement for electronic transmission media, such as high-speed coaxial cable and lower-speed twisted-pair cable. However, even high-speed optical fibers are limited by the electronics at the transmitting and receiving ends, generally rated at a few gigabits per second, although 40 Gb/s systems have been prototyped. Such high-speed electronic systems are expensive and still do not fully exploit the inherent bandwidth of fiber-optic systems, measured in many terabits per second.

All-optical transmission systems offer many intrinsic advantages over systems that use electronics within any part of the principal transmission path. Wavelength-division multiplexing (WDM) electronically impresses different data signals upon different carrier frequencies, all of which are carried by a single optical fiber. The earliest WDM systems did not provide optical switching but only point-to-point WDM.

To achieve optical gain in a semiconductor metal-organic chemical vapor deposition (MOCVD) and molecular beam epitaxy processes have been used to produce complex nanostructures of layered materials such as InGaAs, InGaAsP and InGaAsN. These direct band gap semiconductor materials belonging to group III and V columns of the periodic table of elements are well known sources for LEDs, Lasers, and optical amplifiers. However, these materials make inferior quality high sensitivity photon detectors at fiber communication wavelengths.

It would be desirable to have silicon based lasers, LEDs and optical amplifiers because such devices would help to resolve the difficulties of integrating optical and electronic functions on a single chip. The high thermal conductivity of silicon can result in operational advantages. However, up to now efforts to obtain silicon based LEDs, lasers and amplifiers, especially devices that operate at wavelengths from about 1.3 or 1.5 μm, have not been successful.

There are currently three common methods of doping rare-earth ions into a silicon lattice. These methods are, (i) doping by growth of amorphous material from a silicon/rare-earth compound, (ii) doping by chemical vapor deposition and (iii) ion-implantation and rapid thermal anneal.

The potential of utilizing rare-earth ions in a semiconductor matrix for the development of LED's and lasers, has been reported by H. Ennen, et al., *Applied Physics Letters*, Vol. 43, page 943 (1983). It has also been observed that the presence of oxygen in erbium-doped silicon can increased erbium photoluminescence, P. M. Favennec et al., *Japanese Journal of Applied Physics*, Vol. 29, page L524, (1990)].

Attempts to produce optical gain by the use of rare earths or the inclusion of materials in silicon have also been disclosed in U.S. Pat. Nos. 5,646,425; 5,119,460; 4,618,381; 5,634,973; 5,473,174; and 5,039,190.

However, efforts to create a commercially viable silicon based rare-earth doped LED, laser or optical amplifier have not been successful due at least in part to the fact that the observed luminescence has been too weak to support such a device. Even when weak gain was observed, the radiative lifetimes measured were six orders of magnitude longer than those exhibited by InGaAs devices, making the doped or implanted silicon structures inadequate for telecommunication applications.

There is a need for silicon based, rare-earth containing, optical devices that have sufficient luminescence and strong gain. There is a further need for silicon based, rare-earth containing optical devices that can switch the separate WDM channels, carrier frequencies, in different directions without the necessity of converting optical signals to electronic signals. There is yet a further need for silicon based, rare-earth containing optical devices that are integrated on the same monolithic chip as associated support circuitry. Yet there is another need for silicon based, rare-earth containing optical devices that amplify and/or attenuate light in preferred telecommunications wavelengths, including but not limited to 1250 to 1650 nm. Still there is a further need for silicon based, rare-earth containing optical devices that use avalanche multiplication effects of silicon coupled with sufficient optical gain due to the presence of an optically active rare-earth ion.

SUMMARY OF INVENTION

Accordingly, an object of the present invention is to provide silicon based, rare-earth containing optical devices that have sufficient luminescence and strong gain.

Another object of the present invention is to provide silicon based, rare-earth containing optical devices that have high rare-earth containing ion densities.

Another object of the present invention is to provide silicon based, rare-earth containing optical devices that can switch the separate WDM channels, carrier frequencies, in different directions without the necessity of converting optical signals to electronic signals.

Still another object of the present invention is to provide silicon based, rare-earth containing optical devices with ion densities of at least $10^{20}$ ions per cubic cm.

Yet another object of the present invention is to provide silicon based, rare-earth containing optical devices with high densities of optically activated tri-valent rare earth.

Yet another object of the present invention is to provide silicon based, rare-earth containing optical devices with silicon-based crystal field engineering to control the symmetry of the atoms comprising the superlattice.

Yet another object of the present invention is to provide silicon based, rare-earth containing optical devices with high densities of optically activated tri-valent rare earth.

A further object of the present invention is to provide silicon based, rare-earth containing, periodic superlattice optical devices.

Yet another object of the present invention is to provide silicon based, rare-earth containing optical devices that are integrated on the same monolithic chip as associated support circuitry.

A further object of the present invention is to provide silicon based, rare-earth containing optical devices that amplify and/or attenuate light in preferred telecommunications wavelengths, including but not limited to 1250 to 1650 nm.

Another object of the present invention is to provide silicon based, rare-earth containing optical devices that use avalanche multiplication effects of silicon coupled with sufficient optical gain due to the presence of an optically active rare-earth ion.

These and other objects of the present invention are achieved in a photonic device with a silicon semiconductor based superlattice. The superlattice includes a plurality of layers that form a plurality of repeating units. At least one of the layers in the repeating unit is an optically active layer with at least one species of rare earth ion.

BRIEF DESCRIPTION OF THE DRAWINGS

FIG. 2(a) is a cross-sectional view of one embodiment of a photonic device of the present invention with silicon monolayers, erbium atoms and crystal growth modifiers.

FIG. 2(b) is a close up, cross-sectional view of one embodiment of the superlattice of the present invention that is grown on a (111)-orientated surface.

FIG. 2(c) is a top down perspective view of one embodiment illustrating a superlattice of the present invention with an erbium layer, a silicon layers below and above the plane of the erbium layer.

DETAILED DESCRIPTION

Figure 1A:
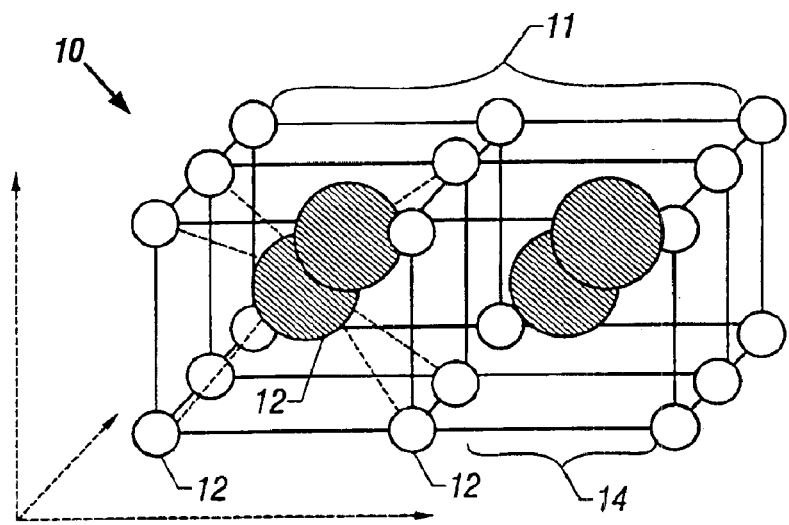
FIG. 1(a) is a perspective view of a superlattice structure of the present invention illustrating one embodiment of a crystalline structure.
Figure 1B:
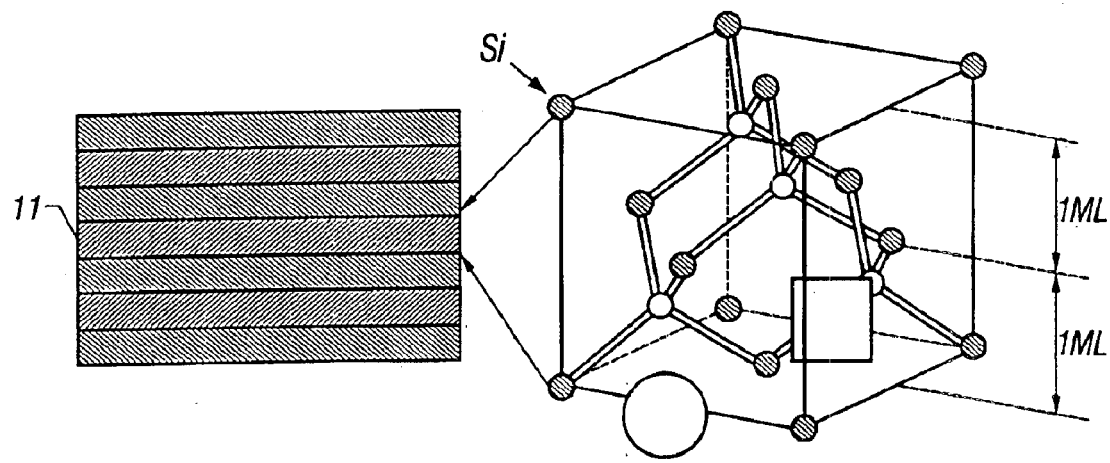
FIG. 1(b) is a perspective view of a superlattice of the present invention illustrating an erbium trivalent ion inside an active region layer that generates a crystal field.

Referring now to FIGS. 1(a) through 2(d), in one embodiment of the present invention a photonic device 10 is a silicon based superlattice 11. Superlattice 11 includes a plurallity of individual layers 12 that form a plurality of repeating units 14. At least one of layer 12 is an active region layer 16 with at least one rare earth ion. FIG. 1(b) illustrates one embodiment of superlattice 11 with an erbium trivalent ion inside active region layer 16 that generates a crystal field.

Preferably repeating units 14 are periodic. At least a portion of active region layer 16 can be a narrow or a wide band gap semiconductor. This can be achieved when the rare-earth ion is grown as part of a narrow band gap silicon-based material or when the rare-earth ion is introduced into the material effectively to make the material a narrow band gap material. Photonic device 10 can be an LED, amplifier, laser, photodetector, AWG, modulator, phototransistor, quantum logic gate, photonic bandgap structure, FET, MOSFET, HFET, HBT, waveguide, and the like.

In one embodiment, superlattice 11 includes at least one amorphous layers 12. In another embodiment, at least one of the layers in at least one repeating unit 14 has an amorphous layer 12. At least one crystal growth modifier can be included in an individual layer 12 of each repeating unit 14. Suitable growth modifiers include but are not limited to C, As, P, B, H, O, N, Sn, Pb and the like. Additionally, during the deposition of each layer 12, additional iso-electronic centers can be added, including but not limited to oxygen, nitrogen and the like, to enhance or activate the rare-earth and control the deposition growth or surface structure of the atoms (i.e., the reconstruction).

Photonic device 10 can be a component in a telecommunication system. In various embodiments, photonic device 10 can produce optical gain to drive a laser emission at a preferred wavelength, for example 1500 to 1650 nm, amplify an incident optical signal, overcome optical losses of other system elements, or detect a optical signal at a preferred wavelength.

Photonic device includes a superlattice that can be made of a variety of different layers and combinations thereof, 12 including but not limited to, silicon, silicon germanium, silicon oxide, oxygen-doped silicon, RE-doped silicon, rare earth silicates ($Re_xSi_{1-x}$), rare earth silicon germanium ($Re_x(SiGe)_{1-x}$) and the like.

In one embodiment, superlattice 11 consists of dissimilar materials of type A, B and C in repeating units 14, for example, of the type (ABA . . . ABA), or (ABCABC . . . ABC). The number and composition of repeating units 14 is determined by the rare-earth ion interaction cross-section or density required; i.e., to increase interaction cross-section, either the number of layers is increased, or the rare earth density in each active layer is increased, or a combination of both. The density of the rare-earth ion is determined by the stoichiometry of the layer 12 which includes the rare-earth ion. Another embodiment is an ABCABC layer sequence with dissimilar materials A, B, and C.

Oxygen is an electronegative atom and very efficient in bonding the rare-earth into a trivalent state. Therefore, oxygen doped silicon or silicon-based silicides are useful as component layers of superlattice 11. In one embodiment of the ABA repeating unit 14 layer sequence, the A layer is an oxygen deficient erbium silicide, represented as $Er_xSi_{1-x}$ material, or an erbium containing silicon-germanium material, represented as $Er_x(Si_yGe_{1-y})_{1-x}$. The B layer is an oxygen containing non-stoichiometric or stoichiometric silicon-based material such as $SiO_x$, $SiGeO_x$, or oxygen-doped silicon.

In one specific embodiment, layer A is an erbium containing silicon-based layer that is oxygen deficient; layer B is a silicon-rich erbium and oxygen deficient material layer; and Layer C is an oxygen containing silicon-based layer deficient of rare-earth ions. In this particular structure the erbium and oxygen silicon-based layers, respectively, are separated spatially by a predominately silicon transition layer which is deficient in both erbium and oxygen. Permutations of the preceding can be grown in order to gain the highest compromise between epitaxial structural ordering for low defect density and optical activation of the rare-earth ion.

Photonic device 10 can have at least one spacer layer 18 between two adjacent repeating units 14. Additionally, a spacer layer 18 can be positioned between more than one pair of adjacent repeating units 14, including all adjacent repeating units 14. The spacer layer is used to improve the structural quality, symmetry, optical quality, or electronic quality of the superalattice. Additionally, superlattice 11 can be positioned or grown on a substrate 20, including but not limited to a silicon substrate, or on a pseudo-substrate buffer layer 22 that has a lattice constant which is different from a lattice constant of a bulk silicon substrate. Where a psuedo substrate is defined as thick layer with low defect surface density that is grown over the substrate.

In one specific embodiment, superlattice 11 is grown on silicon substrate 20 along (001)- and (111), (211), (311), (411) and the like growth directions of the silicon substrate 20. The growth of the lattice matched and/or lattice mismatched layers 12 can be epitaxially grown on silicon substrate 20 or on a pseudo substrate 22 that can be a bulk or superlattice strained, or relaxed buffer layer. FIG. 2(b) illustrates superlattice 11 growth in the (111) direction. FIG. 2(c) illustrates an in-plane erbium/silicon active layer crystal structure without defects grown on a (111)-orientated surface.

In various embodiments, active region layer 16 has a lattice layer that is less than, the same as or equal to a lattice constant of silicon substrate 20 or pseudo-substrate buffer layer 22. It may be preferred for active region layer 16 containing the rare-earth atoms to be in a mechanically stressed state when grown epitaxially on silicon substrate 20 or pseudo substrate 22 by either tension, lattice mismatching or compression. This reduces the defect density which in turn improves structural quality.

In certain embodiments, at least one layer in a repeating unit 14 has a lattice constant that is sufficiently different from, (i) a lattice constant of substrate 20 to have an opposite state of mechanical stress or (ii) a lattice constant of pseudo-substrate buffer layer 22 to have an opposite state of mechanical stress. In one embodiment, at least two layers 12 of repeating units 14 have substantially equal and opposite mechanical strain states and, (i) each repeating unit 14 is substantially lattice matched to substrate 20 or (ii) each repeating unit 14 is substantially lattice matched to pseudo-substrate buffer layer 22. Additionally, the crystal field of the superlattice can be modified by a strain field induced by lattice mismatched layers in a repeating unit.

One example of strain balanced growth is an erbium containing silicon-based layer 12 that exhibits a lattice constant smaller than bulk silicon and is a lattice mismatched layer 12. Pseudomorphic growth of the lattice mismatched layer 12 can occur if the critical thickness of an erbium silicide layer 12 is not exceeded. The erbium silicide layer 12 is elastically deformed and under tensile strain.

The tensile strain can be balanced by the growth of an equal but opposite strain using, for example, a silicon germanium alloy where the amount of germanium is selected so the lattice constant is larger than that of bulk silicon and the layer thickness is tuned to counteract the tensile force of the erbium silicide layer with an equal but opposite compressive force. If both of these layers 12 are below the critical layer thickness and are stable, then the tensile and compressively strained layer pairs can be repeated N times, where N can be a very large number, for example up to 10,000, such that the total thickness of the resulting superlattice is up to three orders of magnitude larger than the critical layer thickness of each of individual strained layers 12. In this embodiment, the pseudomorphically grown strain balanced superlattice can be grown free of interfacial misfit dislocations and thus substantially free of surface states and trap level defects This type of strain balanced growth further reduces the segregation problem of epitaxial growth using impurities or rare-earth ions by periodically trapping the rare-earth ions below rare-earth deficient silicon-based layers. This method substantially solves the problem during epitaxial growth of layers involving segregating species- as they behave as a surfactant and are thus difficult to incorporate at high densities.

Repeating units 14 can have, (i) uniform layer constructions., (ii) non-uniform layer constructions, (iii) thickness that vary as a function of distance along a superlattice growth direction, (iv) layer chemical compositions and layer thickness that vary as a function of distance along a superlattice growth (v) at least two individual layers 12, (vi) at least two individual layers 12 that have different thickness, (vii) at least two individual layers 12 that are made of different compositions, (viii) at least three individual layers 12 that are made of different compositions, (ix) a silicon layer 12 that includes rare earth ions, (x) a silicon germanium layer 12, (xi) a silicon oxide layer 12, (xii) an oxygen-doped silicon layer 12, (xiii) a rare earth silicide layer 12, (xiv) a rare earth silicon germanium layer, (xv) an electrically doped p- or n-type layer 12 or (xvi) hydrogenated silicon 12, silicon oxynitride 12, hydrogenated silicon oxynitride, the same thickness and a thickness of the individual layers of the repeating units varies as a function of distance along a superlattice growth direction.

At least a portion of repeating units 14 can have different thickness, such superlattice 11 may be varied adjusted to control optical or structural properties that vary in the growth process. Each repeating unit can be repeated N times, where N is a whole or partial integer. Repeating units 14 cab be made of layers 12 that are thin. In one embodiment, the thin layers 12 have a thickness of 1000 Å or less and in another embodiment they are thin enough be non-bulk material layers 12.

The rare earth ion is preferably Er, Pr, Nd, Nd, Eu, Ho or Yb, and more preferably Er. In one embodiment, the rare earth ion has an energy level that is determined by a geometric symmetry of a crystal field produced by the constituent atomic arrangement and layer geometry of the superlattice 11.

The crystal field of photonic device 10 is configured to be variable by altering the composition of the individual layers 12. This is achieved by the growth of several superlattices on top on each other, with each superlattice being a constant composition of repeating units 14 but the number of repeating units 14 can vary in each superlattice. Alternatively, the crystal field of photonic device 10 can be configured to be variable by altering the thickness and chemical composition of individual layers 12.

Active region layer 16 can include two or more different rare earth ions. This facilitates optical or electrical pumping of one ion by energy transfer from the other ion. Additionally, active region layer 16 can have a lattice constant substantially different to bulk silicon. Varying the lattice constant enables the electrical and optical properties to be adjusted and optimized.

Figures 1, 2, 2D:
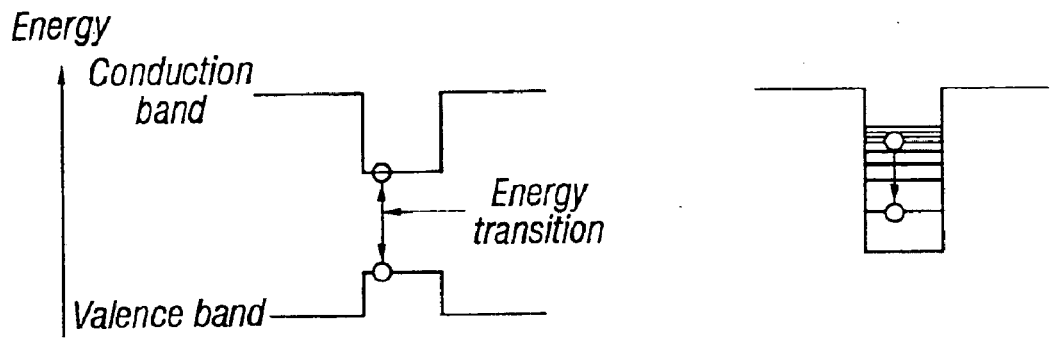
FIGS. 2D-1 and 2D-2 graphically illustrates a prior-art inter-band transition band between conduction and valence bands, compared to an intra-band transition of the present invention, with a three dimensionally confined quantum well structure that behaves as a true quantum dot.

Additionally, as illustrated in FIG. 2(d), the present invention provides intra-band transition of three-dimensionally configured quantum well structures, e.g., a rare earth atomic transition can behave as a true quantum-dot. This is contrasted with inter-band transitions between conduction and valence bands.

Figure 3:
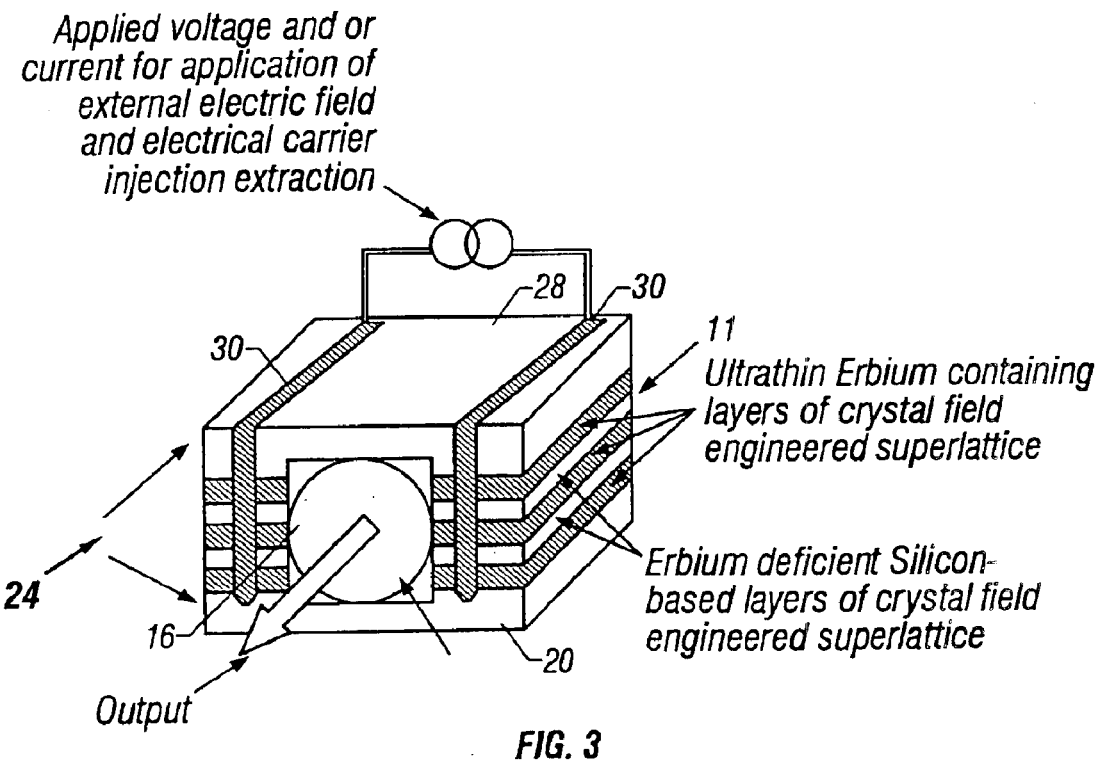
FIG. 3 is a schematic diagram of an embodiment of an optical device of the present invention electrodes and a core structure that can include alternating layers of silicon or silicon based compositions and rare earths.

Referring to FIG. 3, optical device 10 has a core structure with alternating layers of silicon or silicon based compositions and rare earths. The rare earth can be capped with top and bottom layers 26 and 28 that can be pure silicon layers. Electrical contacts 30 are applied by implanting electrical dopants, including but not limited to rare earths or metals, to form low Schottky barrier suicides through top cap 26 into a core of superlattice 11. Electrical contacts 30 can be implanted. This implantation method is described in U.S. Pat. No. 4,394,673, incorporated herein by reference. Erbium or other rare-earth silicide is a suitable material for electrical contacts 30 because it is ideal for high speed operation of optical gain/loss device 24 due to the superior ohmic contact resistance of the material. Such materials include di-silicides, refractory metals and aluminum.

Optical gain/loss 24 can be a waveguide 24 for optical propagation by mode confinement through a refractive index change. Planar electrical devices using monolithic approaches involving selective implantation can be utilized with waveguide 24 including but not limited to, planar, or lateral, p-i-n, n-i-n or p-i-p. The in-plane carrier mobility of superlattice 11 is generally higher than vertical transport in a direction perpendicular to layers 12. The present invention can also be a hybrid HBT or HFET device that provides multi-electro-optic mode control. This can be achieved by incorporating in-plane carrier extraction and injection using electrical contacts 30 in conjunction with the electric fields that are produced above and below superlattice 11.

Figure 4A:
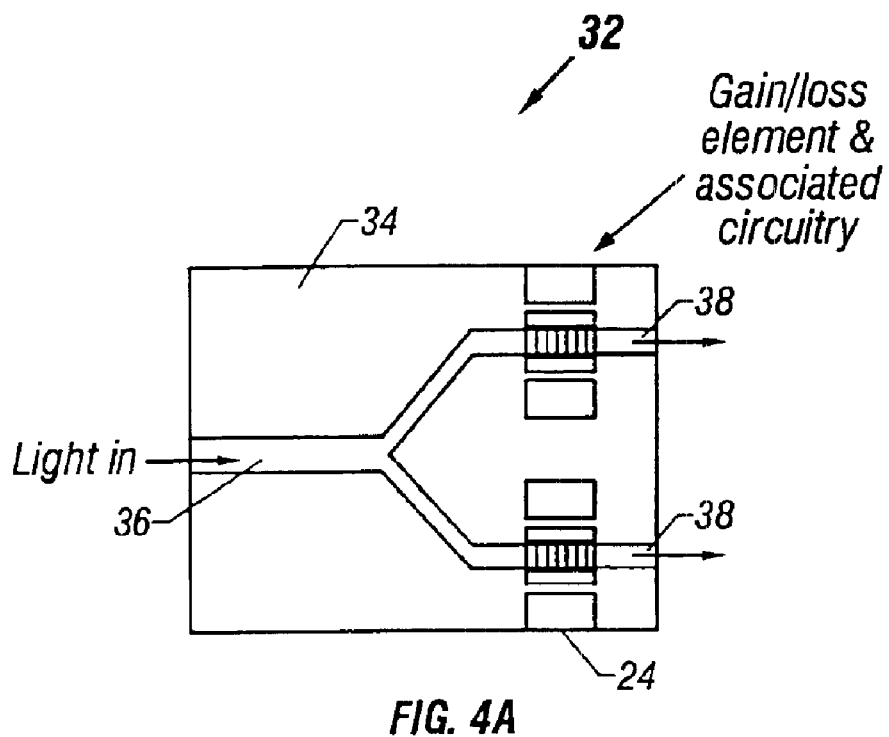
FIG. 4(a) is a perspective view of an switch embodiment of the present invention.
Figure 4B:
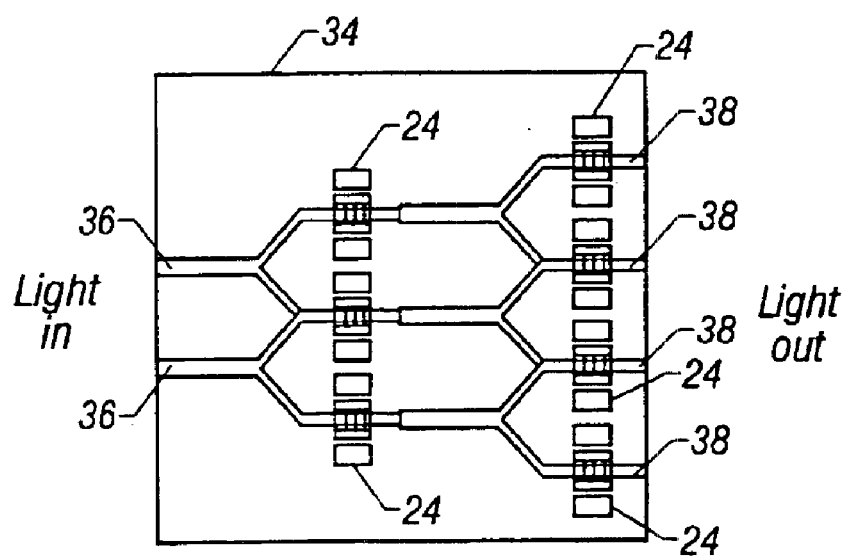
FIG. 4(b) is a perspective view of an all optical multiplexer of the present invention.

In one embodiment, illustrated in FIGS. 4(a) and 4(b), optical device 10 is a switch 32. At least two optical gain devices 10 are combined on a substrate 34. In FIG. 4, an input 36 is split and coupled to first and second gain/loss devices 24, that can be fabricated on substrate 34, and to two outputs 38. The split can cause loss. First and second gain/loss devices 38 are biased for gain or loss to produce amplification or attenuation. The basis of optical switch 32 uses the simultaneous gain in one waveguide 24 and loss in the other to channel light through the former and not the latter. Splitting loss can be overcome in one or both waveguides 24.

In FIG. 4(b), an all optical multiplexer 40 includes two inputs 36 input fibers that are optically routed to any of four outputs 38. The FIG. 4(b) architecture can be scaled to include any number of inputs 36, outputs 38 and gain/loss devices 24 to form the fundamental fabric of an optical network router and replaces optical-electrical-optical switching with an all optical architecture.

Figure 5:
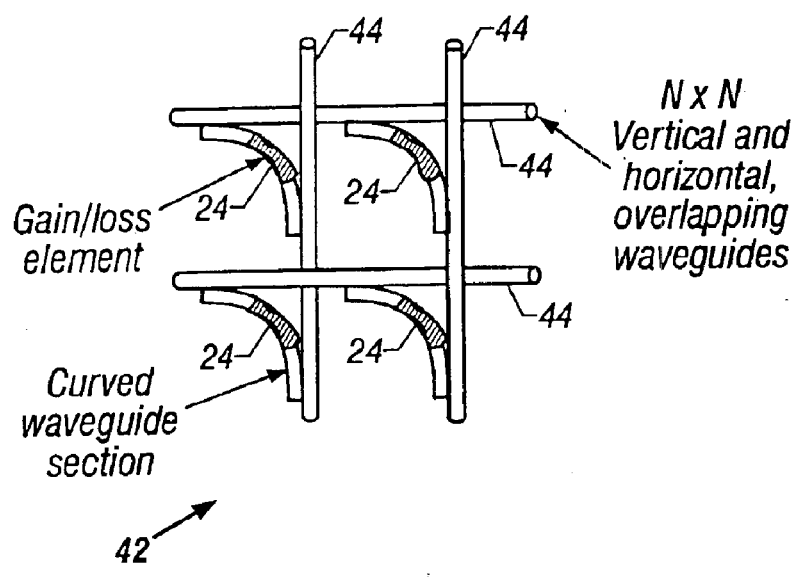
FIG. 5 is a schematic diagram of an N×N optical cross-connect embodiment of the present invention.

The FIG. 4(b) architecture can be scaled to an N×N optical cross-connect (OXC) 42 illustrated in FIG. 5. In this embodiment, optical gain/loss devices 24 are curved rather than linear. Light is coupled into and out of substrate 34 with a number of "N" conventional linear waveguides 44 that crisscross substrate 34 to form an N×N grid. pattern. Linear waveguides 44 traverse in orthogonal directions where each direction is on a different level in the growth direction of substrate 34. Each curved optical gain/loss device 24 joins the orthogonal linear waveguides 44. Light is coupled into and out of the linear waveguides 44 and there is suppressed mode interference over the region where curved gain/loss waveguides 24 join with and linear waveguides 44. Optical gain/loss devices 24 overcome the losses associated with the suppressed mode coupling, and light is switched between two orthogonal inputs when optical gain is initiated in curved optical loss/gain devices 24.

Figure 6:
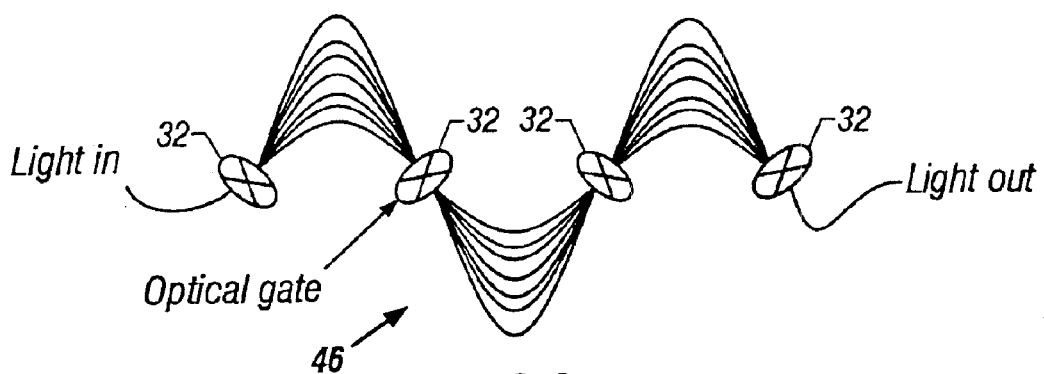
FIG. 6 is a schematic diagram of a wavelength router/selector embodiment of the present invention.

Referring now to FIG. 6, another embodiment of the present invention is a wavelength router/selector 46. In this embodiment, optical switches 32 form optical gates that are combined with passive wavelength routers of the type disclosed in U.S. Pat. No. 5,351,146, incorporated herein by reference. The passive wavelength router splits the various DWDM channels into separate waveguide gratings and then directs them into appropriate output fibers.

Selection of an output port is determined by the choice of wavelength used. Because multiple wavelengths may be used on each output fiber, multiple simultaneous wavelength paths exist from each input fiber. The wavelength routing properties of wavelength router/selector 46 are periodic two ways. First, the spacing between frequencies for each output selection are equal. Second, multiple free spectral ranges exist in the wavelength router/selector 46 so that the optical muting property also repeats. This is achieved without power splitting loss because for a given wavelength constructive interference occurs only at the waveguide or optical path designed for that wavelength, an all other waveguides cause destructive interference which prevents energy coupling to them.

The use of optical switches 32 enables wavelength router/selector 46 to be a dynamically re-configurable, all-optical wavelength router. This eliminates the need for optical frequency changers at the interface between the Level-1 and Level-2 networks or within the Level-2 networks. In current networks, this function is performed by multiple optical-electrical-optical conversion which are expensive and bulky.

Figure 7:
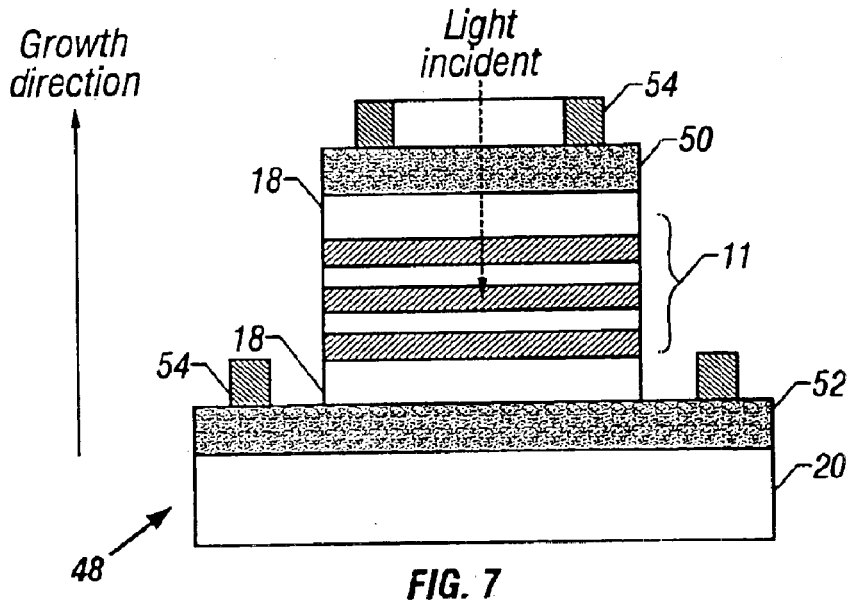
FIG. 7 is a cross-sectional diagram of an optical receiver embodiment of the present invention.

Referring now to FIG. 7, the present invention is also an optical receiver 48 where photons are converted into electrons. Optical receiver includes superlattice 11 positioned between a p-doped layer 50 and an n-doped layer 52 which can both be made substantially of silicon. Electrodes 54 and 56 are coupled to p-doped layer 50 and n-doped layer 52. Electrodes 54 and 56, in combination with other circuit elements, provide biasing, small-signal amplification and noise filtering. Superlattice 11 can be integrally formed with substrate 20 or pseudo substrate 22. Additional elements can be integrated with substrate 20 or pseudo substrate 22. This level of integration enables optimum speed and minimal noise, giving the best signal to noise ratio and excellent detection characteristics.

Figure 8:
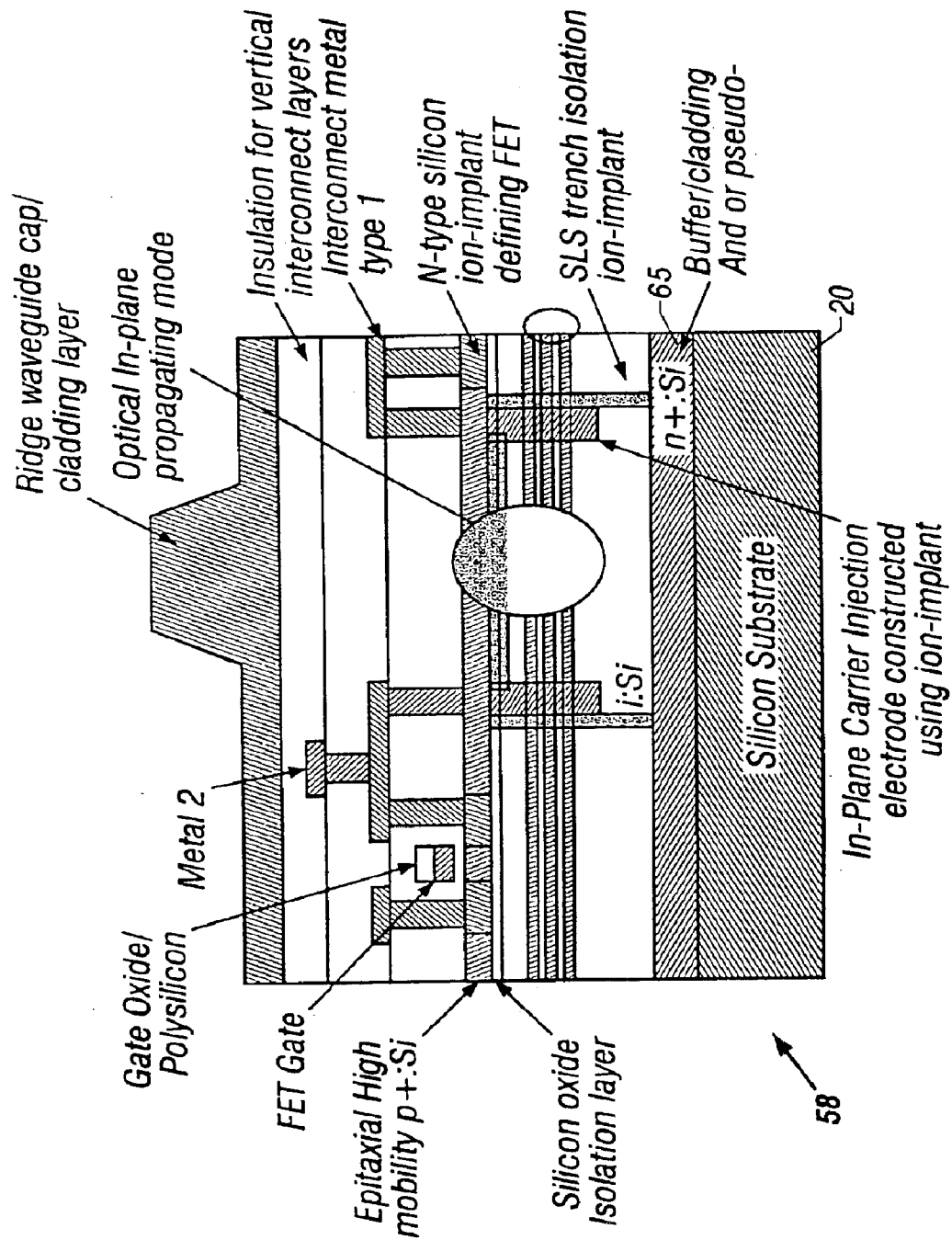
FIG. 8 is a cross-sectional diagram of an edge-emitting laser embodiment of the present invention.
Figure 9:
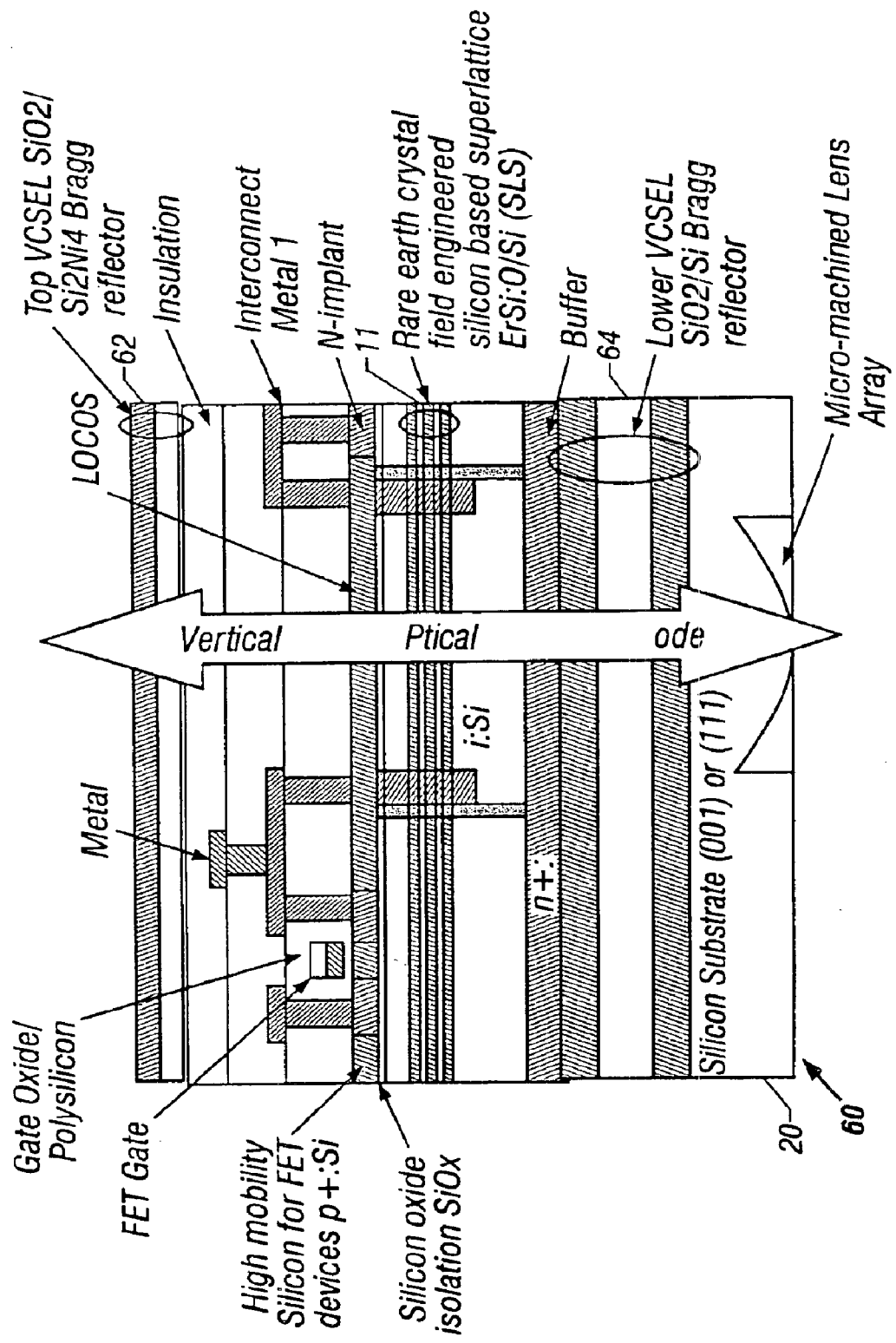
FIG. 9 is a cross-sectional diagram of a VCSEL embodiment of the present invention.

The present invention is also a tunable or non- laser such as an edge emitting laser 58 of FIG. 8 or a VCSEL 60 of FIG. 9.

Edge emitting laser 58 includes superlattice 11 in the plane of substrate 20 or pseudo-substrate 22. Edge-emitting laser 58 includes electrodes to excite superlattice 11, lower and upper optical waveguide cladding layers, a high mobility silicon layer used for electronic transistor construction, n-type well field effect transistors (FET), a field effect, gate oxide layer, a silicon oxide isolation layer, and lateral oxidation of silicon layers that are used for electronic and superlattice 11 isolation.

With VCSEL 60, light travels in superlattice 11 orthogonal to the plane of substrate 20 or pseudo substrate 22. First and second mirrors 62 and 64 define a resonant cavity. VCSEL 60 includes electrodes to excite superlattice 11, lower and upper optical waveguide cladding layers, a high mobility silicon layer used for electronic transistor construction, n-type well field effect transistors (FET), a field effect, gate oxide layer, a silicon oxide isolation layer, lateral oxidation of silicon layers that are used for electronic and superlattice 11 isolation, and a micromachines silicon micro-lens array in substrate 20.

Reflectors 62 and 64 can be grown as Bragg gratings, or produced by cleaving facets on the ends of substrate 20 or pseudo-substrate 22. This cleaving process is described in U.S. Pat. No. 5,719,077, incorporated herein by reference. The output wavelength of the lasers 58 and 60 can be tuned by varying the repeating unit 14 of superlattice 11, which changes the crystal field and hence the transition energy of the laser transition. Bragg elements Acting either as an integral cavity mirror or external feedback element, can be fabricated at the output end of lasers 58 and 60 to provide feedback which limits and controls linewidth. Tuning and bandwidth can be controlled by varying period of repeating unit 14.

FIG. 8 illustrates one embodiment of the integration of a rare-earth crystal field superlattice 11 grown epitaxially on substrate 20 and pseudo-substrate 22. Following the completion of superlattice 11 a spacer layer 65 is grown to isolate a high mobility silicon layer that is suitable for Si CMOS VLSI. This example of an MBE grown epitaxial compound silicon-based substrate 20 or pseudo-substrate 22 can then be processed to form ion-implantation doped regions, electrical contacts to the doped ion-implanted regions, silicon oxide field effect gate regions and dielectric isolation regions The optical gain material is located beneath the final high mobility silicon layer. Optical gain regions can be electrically isolated using ion-implantation or deep trenches. The optical mode of planar waveguide photonic circuits can be designed as ridge-type, buried core, stripe or implant diffused geometries. Relative temperature stability of the emission wavelengths of the gain spectrum allow high frequency and power silicon electronics to be operated simultaneously.

The optical waveguide mode can be confined in the core region by appropriate growth of suitable lower cladding material. This can be achieved for the core and cladding layers by selectively altering the layer refractive index via impurity doping; or via the use of silicon germanium alloys or the use of silicon oxide buried layers. The latter example, can be implemented for the lower cladding oxide layers using epi-ready separation by oxygen implantation (SIMOX) silicon wafers, silicon-on-insulator (SOI) or silicon-on-sapphire (SOS) starting substrates 20 or pseudo-substrates 22.

With VCSEL 60, very few layers 12 are required to form mirrors 62 and 64 because the index contrast between layers 12 can be made very large. With the use of a silicon-based material, the refractive index difference between silicon-based DBR mirror 62 and buffer is much higher and the required number of layers 12 for mirrors 62 and 64 can be as low as two to ten.

VCSEL 60 uses superlattice 11 as the gain medium. The cavity is formed by a high reflectivity quarter wave pair Bragg mirror 62 and output coupling quarter wave Bragg reflector 64. The multi period high reflectivity mirror 64 can be grown/fabricated preceding superlattice 11 or as part of the final processing steps of the CMOS compatible process. The backside of substrate 20 can be micro-machined into arrays of micro-lenses or optical fiber receptacles. This process would allow simple alignment of optical-interconnects from chip-to-chip or fiber-to-chip.

Additionally, a wavelength tuning member, sensor and control loop can each be coupled to lasers 58 and 60. In response to a detected change in temperature or optical power the control loop sends an adjustment signal to the tuning member and the tuning member adjusts a voltage or current supplied to laser 58 and 60 to provide a controlled output beam of selected wavelength.

Figure 10:
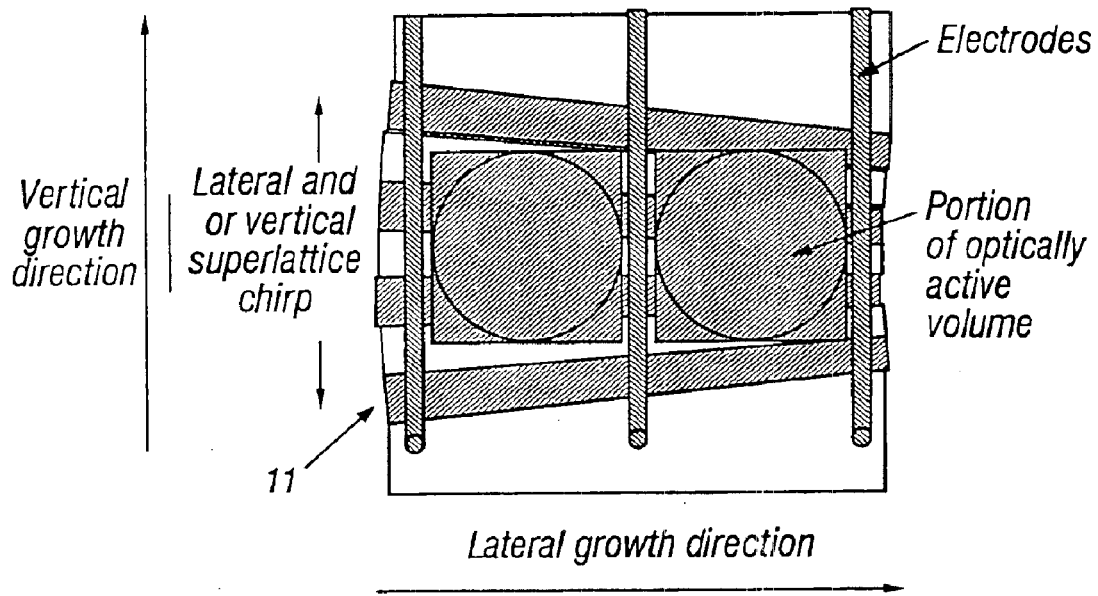
FIG. 10 is a cross-sectional diagram of one embodiment of a chirped superlattice of the present invention.

The period of repeating unit 14 can be chirped across substrate 20 or pseudo substrate 22 as shown in FIG. 10. This provides a controlled variation of wavelength based on the position on substrate 20 or pseudo substrate 22. The crystal field varies with physical period and composition of the superlattice, thus varying the period in a continuous fashion (i.e., chirp) causes a continuous shift in crystal field and therefore laser output wavelength. Multiple lasers with different wavelengths, separated by discrete steps, can be produced on a single substrate 20 or pseudo substrate 22. This provides discrete step tuning from a single component with internal circuitry simply by electronic selection of the appropriate wavelength laser. that can be created on the same substrate 20 or pseudo substrate 22 using standard VLSI techniques. In this manner, lasers 58 and 60, and their electronic switching fabric, reside on the a single substrate 20 or pseudo substrate 22. The appropriate laser wavelength is then selected by electrical input signals which on-board chip components decode, or by simple external wiring which can be grown as selective area growth MOCVD. With this concept, superlattice 11 can be initially grown as a structure that changes its layer 12 thickness uniformly across a cross-sectional area. This is useful for a transmitter in a DWDM system.

Figure 11:
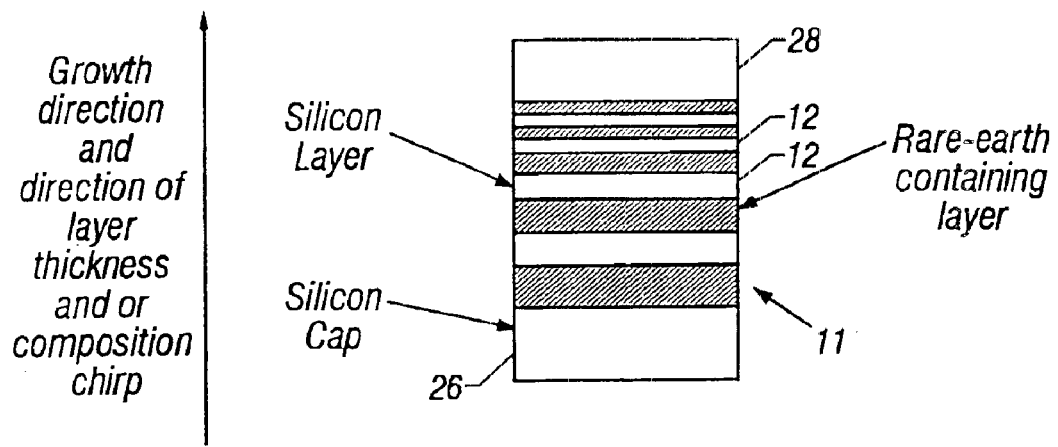
FIG. 11 is a cross-sectional diagram of one embodiment of a chirped superlattice of the present invention.

As illustrated in FIG. 11, superlattice 11 can also be chirped by varying the thickness of the alternating rare-earth layers. In this embodiment, both the bandwidth and center wavelength are controlled.

Figure 12:
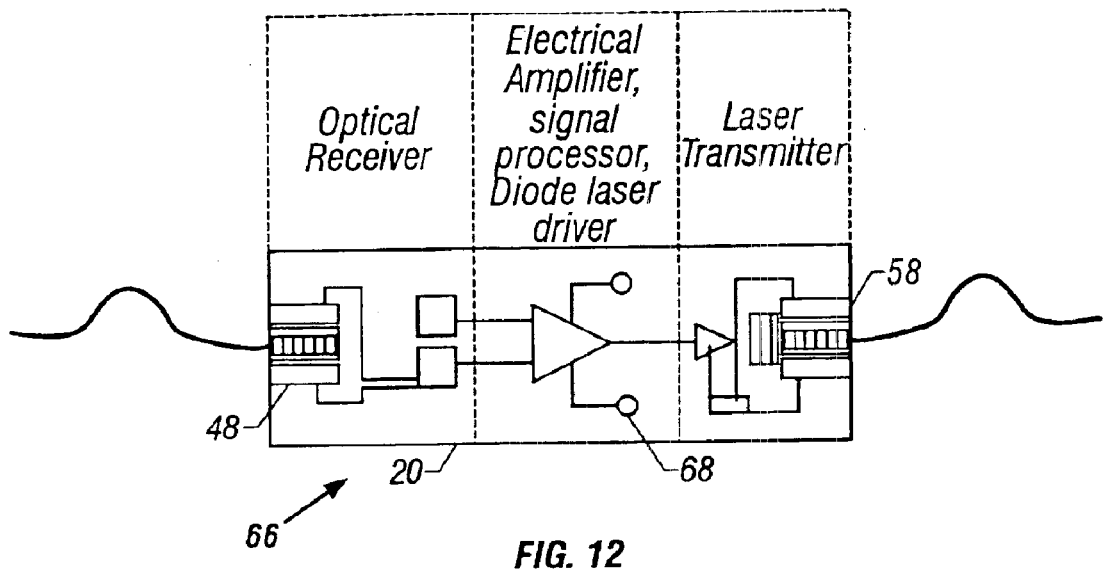
FIG. 12 is a perspective view of a transceiver embodiment of the present invention.

Referring now to FIG. 12, optical receiver 48 can be combined with laser 58 or 60 on the same substrate 20 or pseudo substrate 22 to form a monolithic transceiver 66. Circuitry 68 is also fabricated on the same substrate 20 or pseudo substrate. Circuitry 68 can include an electrical amplifier, signal processor, diode laser driver and the like. Circuitry 68 can be used to, bias optical receiver 48 and lasers 58, 60, amplify the photons detected by optical receiver 48, drive and modulate laser 58 and 60, and the like. Circuitry 68 enables conversion of photons into electrons and enable electrons to drive and modulate laser 58 and 60. Monolithic transceiver 66 can be used to replace the discrete elements in a standard telecommunications router.

Figure 13:
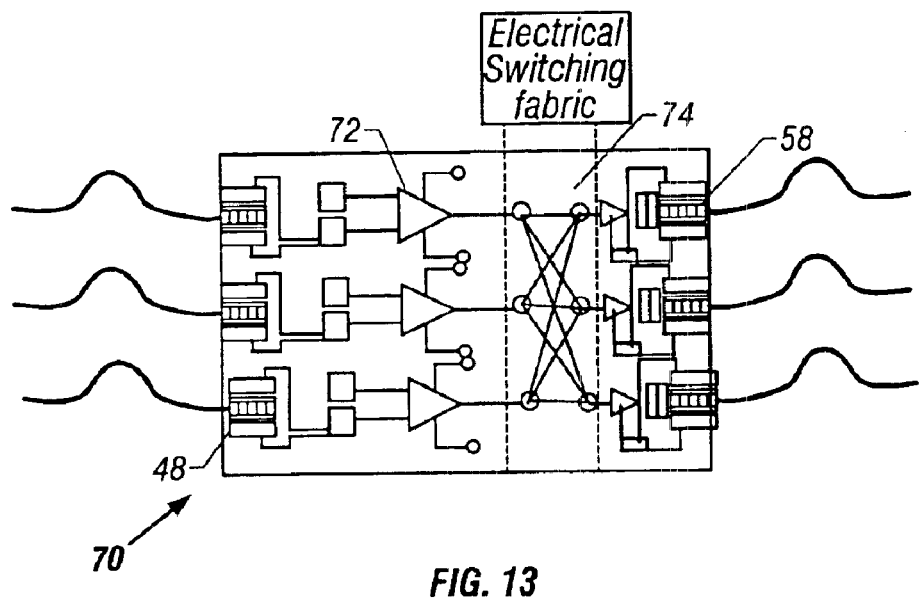
FIG. 13 is a perspective view of an optical router of the present invention.

In another embodiment, illustrated in FIG. 13, a monolithic optical router 70 includes a plurality of lasers 58 and 60 and a plurality of optical receivers 48 all combined on a single substrate 20 or pseudo substrate 22 with circuitry 72. Circuitry 72 biases the plurality of lasers 58 and 60 and optical receivers 48 to amplify the photons that are detected and then drive and modulate the plurality of lasers 58 and 60. An additional set of circuit elements forms an electrical switching fabric 74 that enables signals generated by one or more of the optical receivers 48 to be routed to any laser 58 and 60. Monolithic optical router 70 enables optical signals on any one of an input to be switched to any one of the outputs.

Figure 14:
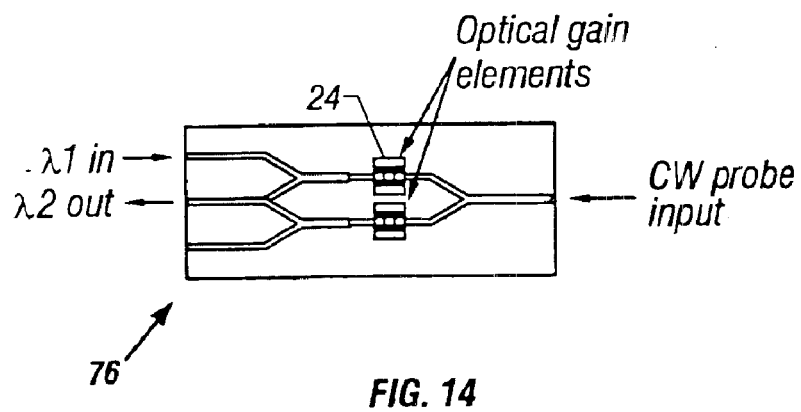
FIG. 14 is a perspective view of a wavelength converter embodiment of the present invention.

Another embodiment of the present invention, illustrated in FIG. 14, is a wavelength converter 76 with at least two optical loss/gain devices 24. of Data is carried via modulated on an optical signal at a first wavelength, and input to the waveguide. A second wavelength is input to the waveguide and mixes with the first wavelength. The modulation from the first wavelength is transferred to the second wavelength by cross-gain or cross-phase modulation. The traveling wave (single pass) gain receives simultaneously the modulated optical signal at the first wavelength and the second optical signal at the desired wavelength. The first optical signal affects the gain of the traveling wave gain as seen by the second optical signal so as to impress a representation of variations in the envelope of the first optical signal onto the second optical signal. The basic structure is that of a Mach-Zehnder interferometer with cross-phase modulation.

Figure 15:
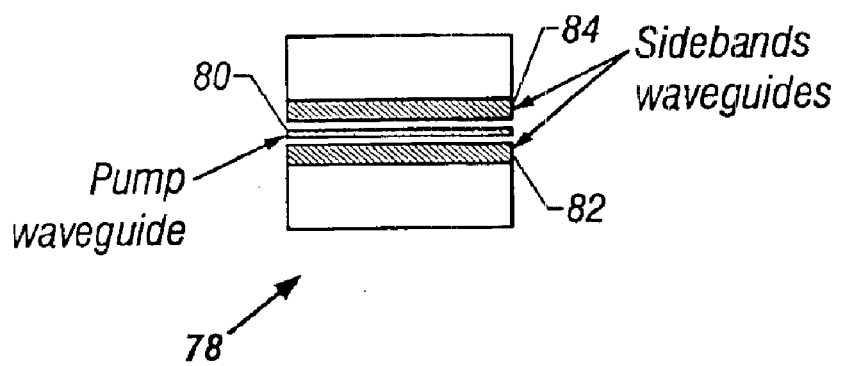
FIG. 15 is a perspective view of a parametric non-linear optical element of the present invention.

FIG. 15 illustrates a parametric nonlinear optical element 78 embodiment of the present invention. Superlattice 11 forms a first waveguide 80, which can be optical loss/gain device 24, that is optimized for optical gain an a predetermined pump wavelength, e.g. 1540 nm. Additional superlattice structures 11 form second and third waveguides 82 and 84 on opposite sides of first waveguide 80. Second and third waveguides 82 and 84 are optimized for side-band frequencies adjacent to the pump wavelength, including but not limited to 1650 nm and 1450 nm.

Second and third waveguides 82 and 84 are positioned sufficiently close (i.e., close to the wavelength of the light; e.g. 1.5–3 um for 1500 nm light) as to achieve evanescent wave-coupling to first waveguide 80 in order to allow coupling. When the pump wavelength propagates through first waveguide 80 sideband wavelengths are driven in second and third waveguides 82 and 84, and energy flows from the pump wavelength to the sideband wavelengths. This creates a passive wavelength converter through nonlinear optical coupling. Subsequent to the conversion, additional optical loss/gain devices 24 can be placed in order to suppress the residual pump and enhance either or both of the sideband wavelengths. In this embodiment, parametric nonlinear optical element 78 becomes an active element which switches between adjacent DWDM channels to allow wavelength routing.

Figure 16:
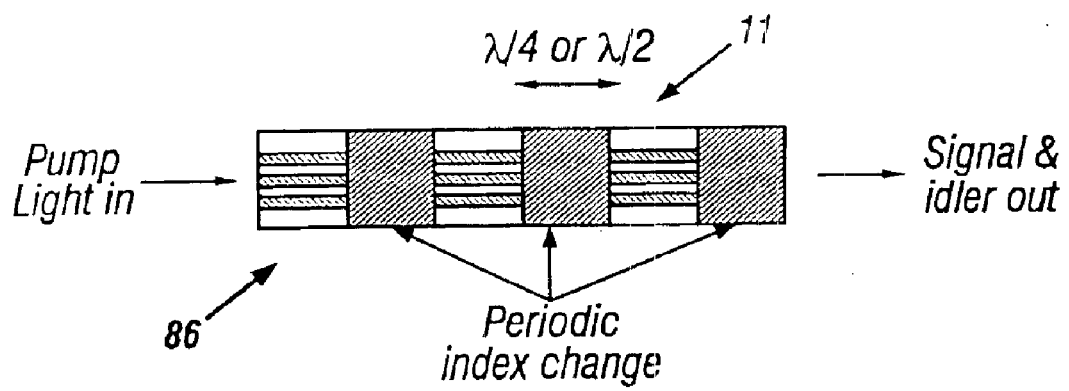
FIG. 16 is a perspective view of a quasi-phase-matched nonlinear element embodiment of the present invention.

The present invention is also a quasi-phase matched nonlinear element 86, as shown in FIG. 16. In this embodiment, superlattice 11 is grown with a periodic variation in refractive index in order to induce gain at signal or idler frequencies of the input beam to quasi-phase matched nonlinear element 86. The periodic variation is chosen to achieve quasi-phase-matching through periodic refractive index variation at the appropriate frequency. In this embodiment, the active region layers 16 act as a nonlinear optical crystal whose gain can be electrically enhanced. The signal and idler frequencies are those of an optical parametric oscillator (OPO) in the 1000–2000 nm telecommunications band. Acting as an OPO, the active region layers 16 can shift an input DWDM wavelength to another wavelength with the energy difference carried off by the idler wavelength.

Figure 17:
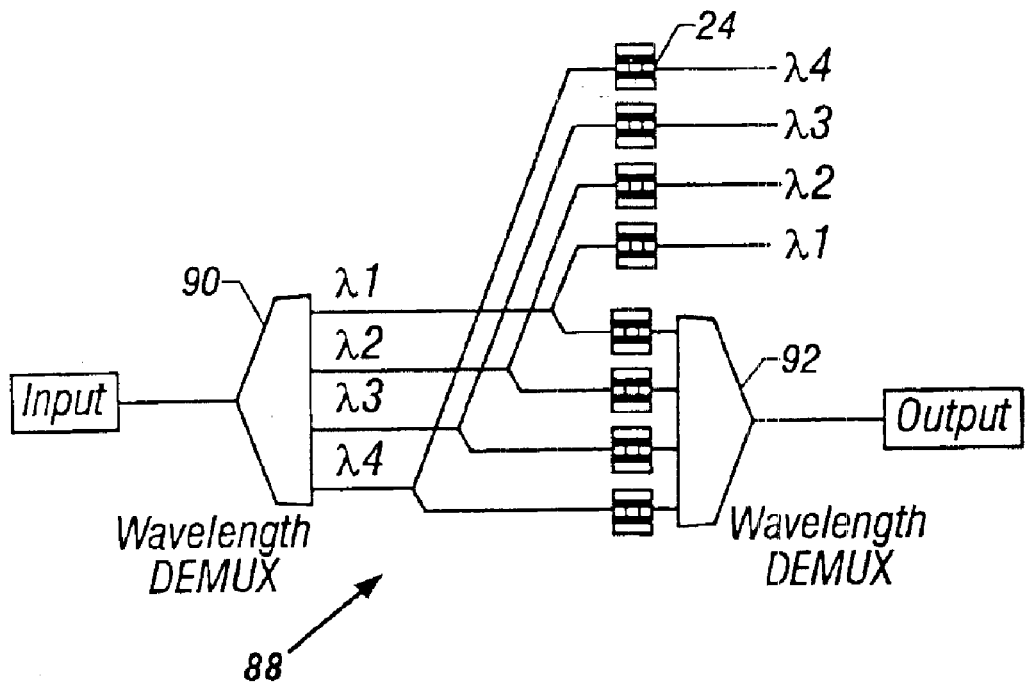
FIG. 17 is a perspective view of an all optical add-drop multiplexer embodiment of present invention.

In another embodiment, illustrated in FIG. 17, multiple optical loss/gain devices 24 gain/loss elements are used in an all optical add-drop multiplexer (OADM) 88. OADM 88 includes an optical demultiplexer 90 that splits an input WDM signal into individual optical signals, leading to respective 2×2 switches. Each switch has another input that originates from a plurality of add lines and selects one of its inputs to be dropped and the other to continue along a main signal path.

The retained signals may be modulated and attenuated prior to being tapped and finally multiplexed together by a WDM multiplexer 92. The tapped signals are opto-electronically converted and fed back to a controller, which can include controller software, that controls the switching, modulation and attenuation. This permits remote control of OADM 88 functions by encoding instructions for the controller into a low-frequency dither signal that is embedded within the individual optical signals. OADM 88 can, in real time, be instructed to reroute traffic, dynamically equalize or otherwise change optical channel power levels, and add or remove dither. A specific optical channel may be reserved for control purposes, allowing a network administrator to "log in" to OADM 88 and override the controller software algorithm. Optionally, the optical signals can be tapped upon entry to OADM 88. A di-directional OADM can be constructed from two unidirectional OADM's 88 that can share the same controller. Additionally, a single, general multi-input multi-output switch can be used to provide an arbitrary mapping between individual input and output optical signals.

Figure 18:
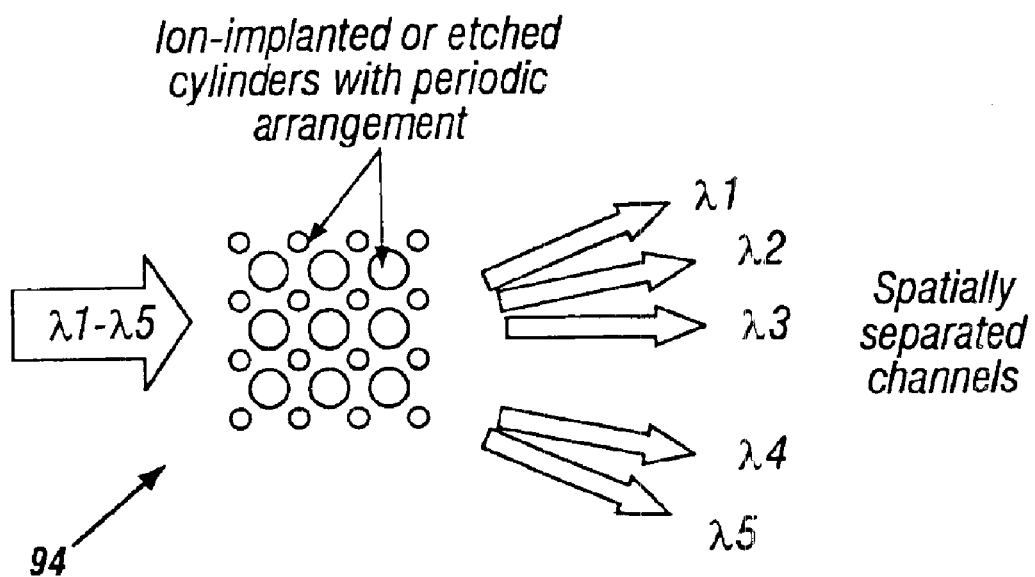
FIG. 18 is a schematic diagram of a two-dimensional photonic bandgap (2D-PBG) structure embodiment of the present invention.

Alternatively, as shown in FIG. 18, the present invention is also a two-dimensional photonic bandgap (2D-PBG) structure 94 implanted in the output path of the input beam or waveguide Bandgap structure 94 includes superlattice 11 with periodic variation, and repeating units 14 of bandgap structure 94 are selected to optimize the diffraction of light. Bandgap structure 94 consists of an array of predominately cylindrical ion-implantation disordering doped or physically etched regions either within or external to the superlattice. orthogonal to the plane of substrate 20 or pseudo substrate 22 which act as a diffraction grating.

Scatter radiation emitted form bandgap structure 94 fans out at angles with the angle of diffraction being determined by the wavelength of the radiation. Thus the photonic bandgap structure acts as a diffraction grating but with substantially higher efficiency and customized dispersion. . Unlike a diffraction grating, bandgap structure 94 directs spatially resolved wavelengths in the forward direction. This is advantageous for highly dispersive, integrated wavelength selective opto-electronic structures. Bandgap structure 94 can be an active DWDM filter that separates various wavelengths. The separated wavelengths can then be coupled into their own waveguides. Each waveguide can then be coupled to a switch 32.

Figure 19:
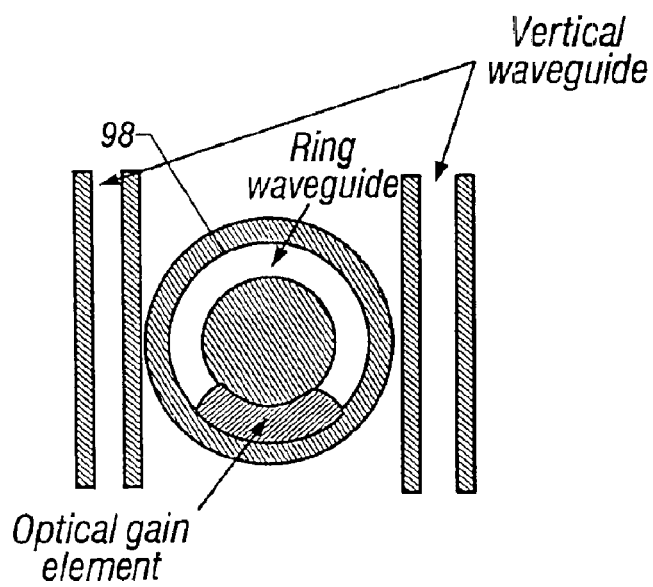
FIG. 19 is a schematic diagram of a selectable wavelength add/drop multiplexer embodiment of the present invention with a concentric ring waveguide ring.

In another embodiment, illustrated in FIG. 19, the present invention is a selectable wavelength add/drop multiplexer 96 that has a concentric ring waveguide 98 fabricated in substrate 20 or pseudo-substrate 22 to form a "Light Coral" of the type described by Nanovation, "The Micro revolution", Technology Review" July–August 2000, incorporated herein by reference, in which light of a frequency resonant with ring waveguide 98 is selectively coupled out of one vertical waveguide and into the other vertical waveguide, via ring waveguide 98 which includes a superlattice 11 with optical gain/loss device 24 to enhances or suppress the wavelength coupled into ring waveguide 98. The addition of optical gain/loss device 24 makes ring waveguide 98 act as selectable wavelength add/drop multiplexer 96.

The present invention can also be an actively equalized array waveguide grating shown in FIG. 6. By combining the properties of optical gain and detection in devices that include superlattice II provides integrated optical monitoring devices and systems. Input wavelength division multiplexed signals are separated into the constituent individual wavelengths by the arrayed waveguide grating (AWG) and propagate through individual waveguides. Superlattice 11 can attenuate or amplify each of these signals independently, thereby providing dynamic spectral gain control and equalization. For example, an AWG can include superlattice 11. Waveguides 24 of the AWG can have multiple electrodes that are configured to either provide control of the gain or a photodetection of the propagating optical signal. Active feedback of the gain sections can be controlled by monitoring the optical power in each of the waveguides and thus provide the capability of actively equalizing the AWG.

Figure 20:
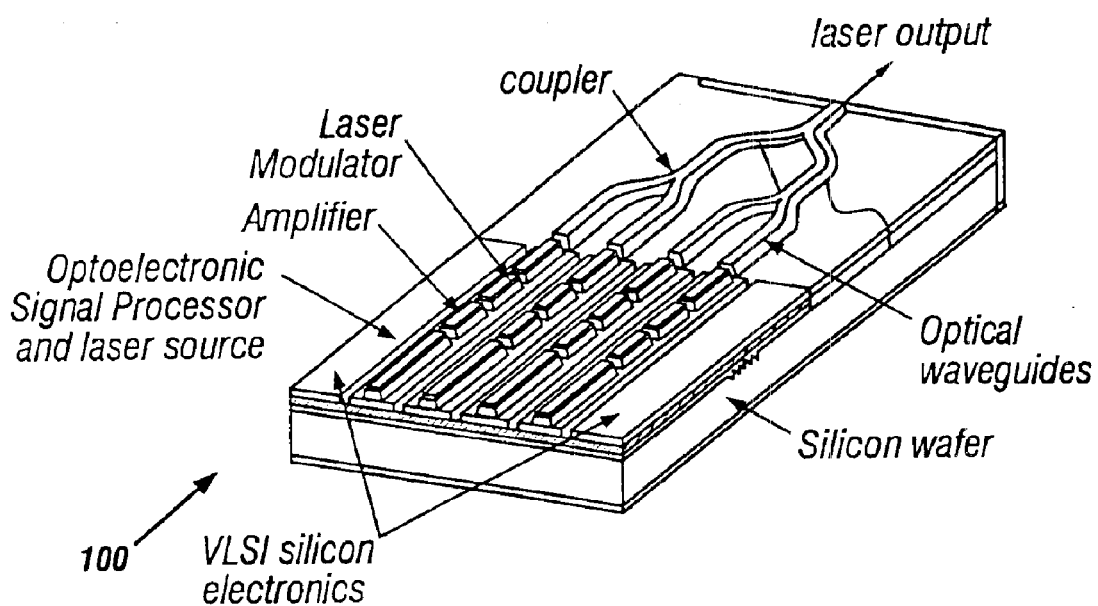
FIG. 20 is a perspective view of an optical integrated circuit embodiment of the present invention.

A further embodiment of the present invention is an optical integrated circuit 100, illustrated in FIG. 20 that includes many of the FIG. 1–FIG. 19 devices and embodiments. Such a circuit combines photons and electrons into a single substrate, fabricated by a single process, and enables both optical and electrical gain and control to be integrated together. Full VLSI functionality including all electrical functions currently employed in silicon VLSI such as memory, switching, gain, computation, fuzzy logic, error checking, and restoration. Likewise, all optical functions currently achieved by discrete passive and active components, such as optical switching, wavelength filtering, optical mixing, amplification, loss, MUX/DEMUX, detection, modulation, laser output, LED, and nonlinear effects, can also be integrated through silicon VLSI.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A photonic device, comprising:
a silicon semiconductor based superlattice that includes a plurality of layers that form a plurality of repeating units, wherein at least one of the layers in the repeating unit is an optically active layer with at least one species of rare earth ion and at least two units in a repeating unit have different thicknesses.

2. The device of claim 1, wherein each layer in the plurality of layers is a pure crystalline structure.

3. The device of claim 1, wherein the rare earth ion is present with a density of at least $10^{18}$ ions per cubic cm.

4. The device of claim 1, further comprising:
one or more cladding layers coupled to the superlattice configured to guide and propagate an optical mode that overlaps at least a portion of the superlattice.

5. The device of claim 1, further comprising:
first and second electrodes, wherein at least a portion of the superlattice is positioned between the first and second electrodes.

6. The device of claim 1, further comprising:
a least one electrode that extends from an exterior of the superlattice to an interior of the superlattice.

7. The device of claim 1, further comprising:
at least one electrically doped p- or n-type layer coupled to the superlattice.

8. The device of claim 1, wherein the optically active layer is sandwiched between doped p- or n-type layers.

9. The device of claim 1, further comprising:
a mode size converter configured to be coupled to an optical fiber and the superlattice.

10. The device of claim 1, wherein the mode size converter is a tapered waveguide structure.

11. The device of claim 1, wherein the repeating units are periodic.

12. The device of claim 1, wherein the repeating units have uniform layer constructions.

13. The device of claim 1, wherein the superlattice structure is selected to create a global crystal field that interacts with the local crystal field of the constituent host layers to produce a pre-determined optical spectrum of the structure.

14. The device of claim 1, wherein a crystal field of the device is configured to be spatially variable by altering composition of layers.

15. The device of claim 1, wherein a composition of the repeating units varies as a function of distance along a superlattice growth.

16. The device of claim 1, wherein at least one of the layers is amorphous.

17. The device of claim 1, wherein at least a portion of the active region layer is a narrow band gap semiconductor relative to other layers in a repeating unit.

18. The device of claim 1, wherein at least a portion of the active region layer is a wide band gap semiconductor relative to other layers in a repeating unit.

19. The device of claim 1, further comprising at least one spacer layer between two adjacent repeating units.

20. The device of claim 19, wherein the spacer layer varies in thickness along a growth direction.

21. The device of claim 1, wherein the repeating units includes ultra-thin layers.

22. The device of claim 21, wherein the ultra-thin layers have a thickness of 1000 Å or less.

23. The device of claim 21, wherein the ultra-layers are thin enough to be non-bulk material layers.

24. The device of claim 1, wherein each repeating unit has two or more layers.

25. The device of claim 1, wherein each repeating unit is repeated N times, where N is a whole or partial integer of monolayers.

26. The device of claim 1, wherein each repeating unit has at least two layers made with different compositions.

27. The device of claim 1, wherein each repeating unit has at least two layers with different thicknesses.

28. The device of claim 1, wherein each repeating unit has three layers made of with different compositions.

29. The device of claim 1, wherein each repeating unit has a silicon oxide layer.

30. The device of claim 1, wherein each repeating unit has an oxygen-doped silicon layer.

31. The device of claim 1, wherein each repeating unit includes an electrically doped p- or n-type layer.

32. The device of claim 1, further comprising:
at least one crystal growth modifier M included in at least one crystalline layer of each repeating unit in the form of SiMx, where x is less than 1.

33. The device of claim 32, wherein the growth modifier M is a crystalline compound comprising a rare-earth R and M is at least one of C, H, O, N, P, As, B, Sb, Co, Ni, Ir, Sn and Pb in the form RxMy.

34. The device of claim 1, wherein the rare earth ion is selected from at least one of Er, Pr, Nd, Eu, Ho, Pm, Th, Sm, Tm and Yb.

35. The device of claim 1, wherein the rare earth ion is Er.

36. The device of claim 1, wherein the multi-layer silicon based superlattice is positioned on a silicon substrate.

37. The device of claim 1, wherein the multi-layer silicon based superlattice is grown on a silicon substrate.

38. The device of claim 1, wherein the multi-layer silicon based superlattice is grown on an (001)-oriented surface of the silicon substrate.

39. The device of claim 1, wherein the multi-layer silicon based supertattice is grown on a (111)-oriented surface of the silicon substrate.

40. The device of claim 1, wherein the multi-layer silicon based superlattice is grown on at least one h, k and l-oriented surface of the silicon substratem wherein h, k, and l are sets of integers that are crystallographic Miller indices notation.

41. The device of claim 1, wherein the multi-layer silicon based superlattice is grown on one of a geometrically and compositionally patterned silicon substrate.

42. The device of claim 1, wherein the multi-layer silicon based superlattice is deposited in a superlattice growth direction and has a laterally ordered structure substantially perpendicular to a growth direction.

43. The device of claim 1, wherein the multi-layer silicon based superlattice is deposited in a superlattice growth direction and has a laterally ordered structure substantially perpendicular to a growth direction.

44. The device of claim 1, wherein the multi-layer silicon based superlattice is grown on a silicon-on-insulator Wafer.

45. The device of claim 1, wherein the active region layer has a lattice constant that is less than a lattice constant of an underlying bulk silicon substrate.

46. The device of claim 1, wherein the active region layer has a lattice constant that is less than a lattice constant of a on a pseudo-substrate buffer layer with a lattice constant that is different from a lattice constant of an underlying bulk silicon substrate.

47. The device of claim 1, wherein the active region layer has a lattice constant that is equal to a lattice constant of an underlying bulk silicon substrate.

48. The device of claim 1, wherein the active region layer has a lattice constant that is equal to a lattice constant of a on a pseudo-substrate buffer layer with a lattice constant that is different from a lattice constant of an underlying bulk silicon substrate.

49. The device of claim 1, wherein the active region layer has a lattice constant that is greater than a lattice constant of an underlying bulk silicon substrate.

50. The device of claim 1, wherein the active region layer has a lattice constant that is greater than a lattice constant of a on a pseudo-substrate buffer layer with a lattice constant that is different from a lattice constant of an underlying bulk silicon substrate.

51. The device of claim 37, wherein at least one layer in a repeating unit has a lattice constant that is sufficiently different from a lattice constant of the substrate to be substantially in a state of elastic mechanical stress.

52. The device of claim 37, wherein at least two of layers of repeating units have substantially equal and opposite mechanical strain energy and strain states and each repeating unit is substantially lattice matched to the silicon substrate.

53. The device of claim 37, wherein at least two of layers of repeating units have substantially equal and opposite mechanical energy and strain states and each repeating unit is substantially lattice matched to the pseudo-substrate buffer layer.

54. The device of claim 14, wherein the crystal field is modified by a strain field induced by lattice mismatched layers in a repeating unit.

55. A photonic device, comprising:
a silicon semiconductor based superlattice that includes a plurality of layers that form a plurality of repeating units, wherein at least one of the layers in the repeating unit is an optically active layer with at least one species of rare earth ion and at least two units in a repeating unit are made of different compositions.

56. The device of claim 55, wherein each layer in the plurality of layers is a pure crystalline structure.

57. The device of claim 55, wherein the rare earth ion is present with a density of at least $10^{18}$ ions per cubic cm.

58. The device of claim 55, further comprising:
one or more cladding layers coupled to the superlattice configured to guide and propagate an optical mode that overlaps at least a portion of the superlattice.

59. The device of claim 55, further comprising:
first and second electrodes, wherein at least a portion of the superlattice is positioned between the first and second electrodes.

60. The device of claim 55, further comprising:
a least one electrode that extends from an exterior of the superlattice to an interior of the superlattice.

61. The device of claim 55, further comprising:
at least one electrically doped p- or n-type layer coupled to the superlattice.

62. The device of claim 55, wherein the optically active layer is sandwiched between doped p- or n-type layers.

63. The device of claim 55, further comprising:
a mode size converter configured to be coupled to an optical fiber and the superlattice.

64. The device of claim 55, wherein the mode size converter is a tapered waveguide structure.

65. The device of claim 55, wherein the repeating units are periodic.

66. The device of claim 55, wherein the repeating units have uniform layer constructions.

67. The device of claim 55, wherein the superlattice structure is selected to create a global crystal field that interacts with the local crystal field of the constituent host layers to produce a pre-determined optical spectrum of the structure.

68. The device of claim 55, wherein a crystal field of the device is configured to be spatially variable by altering composition of layers.

69. The device of claim 55, wherein a composition of the repeating units varies as a function of distance along a superlattice growth.

70. The device of claim 55, wherein at least one of the layers is amorphous.

71. The device of claim 55, wherein at least a portion of the active region layer is a narrow band gap semiconductor relative to other layers in a repeating unit.

72. The device of claim 55, wherein at least a portion of the active region layer is a wide band gap semiconductor relative to other layers in a repeating unit.

73. The device of claim 55, further comprising at least one spacer layer between two adjacent repeating units.

74. The device of claim 73, wherein the spacer layer varies in thickness along a growth direction.

75. The device of claim 55, wherein the repeating units includes ultra-thin layers.

76. The device of claim 75, wherein the ultra-thin layers have a thickness of 1000 Å or less.

77. The device of claim 75, wherein the ultra-layers are thin enough to be non-bulk material layers.

78. The device of claim 55, wherein each repeating unit has two or more layers.

79. The device of claim 55, wherein each repeating unit is repeated N times, where N is a whole or partial integer of monolayers.

80. The device of claim 55, wherein each repeating unit has at least two layers made with different compositions.

81. The device of claim 55, wherein each repeating unit has at least two layers with different thicknesses.

82. The device of claim 55, wherein each repeating unit has three layers made of with different compositions.

83. The device of claim 55, wherein each repeating unit has a silicon oxide layer.

84. The device of claim 55, wherein each repeating unit has an oxygen-doped silicon layer.

85. The device of claim 55, wherein each repeating unit includes an electrically doped p- or n-type layer.

86. The device of claim 55, further comprising:
at least one crystal growth modifier M included in at least one crystalline layer of each repeating unit in the form of SiMx, where x is less than 1.

87. The device of claim 85, wherein the growth modifier M is a crystalline compound comprising a rare-earth R and M is at least one of C, H, O, N, P, As, B, Sb, Co, Ni, Ir, Sn and Pb in the form RxMy.

88. The device of claim 55, wherein the rare earth ion is selected from at least one of Er, Pr, Nd, Eu, Ho, Pm, Tb, Sm, Tm and Yb.

89. The device of claim 55, wherein the rare earth ion is Er.

90. The device of claim 55, wherein the multi-layer silicon based superlattice is positioned on a silicon substrate.

91. The device of claim 55, wherein the multi-layer silicon based superlattice is grown on a silicon substrate.

92. The device of claim 55, wherein the multi-layer silicon based superlattice is grown on an (001)-oriented surface of the silicon substrate.

93. The device of claim 55, wherein the multi-layer silicon based superlattice is grown on a (111)-oriented surface of the silicon substrate.

94. The device of claim 55, wherein the multi-layer silicon based superlattice is grown on at least one h, k and l-oriented surface of the silicon substratem wherein h, k, and l are sets of integers that are crystallographic Miller indices notation.

95. The device of claim 55, wherein the multi-layer silicon based superlattice is grown on one of a geometrically and compositionally patterned silicon substrate.

96. The device of claim 55, wherein the multi-layer silicon based superlattice is deposited in a superlattice growth direction and has a laterally ordered structure substantially perpendicular to a growth direction.

97. The device of claim 55, wherein the multi-layer silicon based superlattice is deposited in a superlattice growth direction and has a laterally ordered structure substantially perpendicular to a growth direction.

98. The device of claim 55, wherein the multi-layer silicon based superlattice is grown on a silicon-on-insulator wafer.

99. The device of claim 55, wherein the active region layer has a lattice constant that is less than a lattice constant of an underlying bulk silicon substrate.

100. The device of claim 55, wherein the active region layer has a lattice constant that is less than a lattice constant of a on a pseudo-substrate buffer layer with a lattice constant that is different from a lattice constant of an underlying bulk silicon substrate.

101. The device of claim 55, wherein the active region layer has a lattice constant that is equal to a lattice constant of an underlying bulk silicon substrate.

102. The device of claim 55, wherein the active region layer has a lattice constant that is equal to a lattice constant of a on a pseudo-substrate buffer layer with a lattice constant that is different from a lattice constant of an underlying bulk silicon substrate.

103. The device of claim 55, wherein the active region layer has a lattice constant that is greater than a lattice constant of an underlying bulk silicon substrate.

104. The device of claim 55, wherein the active region layer has a lattice constant that is greater than a lattice constant of a on a pseudo-substrate buffer layer with a lattice constant that is different from a lattice constant of an underlying bulk silicon substrate.

105. The device of claim 91, wherein at least one layer in a repeating unit has a lattice constant that is sufficiently different from a lattice constant of the substrate to be substantially in a state of elastic mechanical stress.

106. The device of claim 91, wherein at least two of layers of repeating units have substantially equal and opposite mechanical strain energy and strain states and each repeating unit is substantially lattice matched to the silicon substrate.

107. The device of claim 91, wherein at least two of layers of repeating units have substantially equal and opposite mechanical energy and strain states and each repeating unit is substantially lattice matched to the pseudo-substrate buffer layer.

108. The device of claim 91, wherein the crystal field is modified by a strain field induced by lattice mismatched layers in a repeating unit.

* * * * *